United States Patent [19]

Miyashita et al.

[11] Patent Number: 5,496,433
[45] Date of Patent: Mar. 5, 1996

[54] HOT PRESS FOR USE IN PRODUCTION OF MULTILAYERED SUBSTRATE

[75] Inventors: Akimi Miyashita, Toride; Mutsumasa Fujii, Ibaraki; Kiyonori Kogawa, Hiratsuka; Masayuki Kyoui, Yokohama, all of Japan

[73] Assignee: Hitachi Techno Engineering Co., Ltd., Tokyo, Japan

[21] Appl. No.: 38,293

[22] Filed: Mar. 29, 1993

[30] Foreign Application Priority Data

Mar. 27, 1992 [JP] Japan ..................... 4-071587

[51] Int. Cl.⁶ .................................. B29C 43/58
[52] U.S. Cl. .................. 156/358; 100/50; 100/93 P; 156/382; 156/583.91; 425/407
[58] Field of Search ................. 156/358, 583.1, 156/498, 583.91, 285, 286, 382; 100/48, 50, 93 P, 99; 425/407, 405.1

[56] References Cited

U.S. PATENT DOCUMENTS

| | | | |
|---|---|---|---|
| 3,953,053 | 1/1976 | Armstrong | 156/358 |
| 4,367,115 | 1/1983 | Bohn et al. | 156/358 |
| 4,666,551 | 5/1987 | Soberay et al. | 156/286 |
| 4,828,472 | 5/1989 | Itoh et al. | 425/405.1 |
| 4,857,135 | 8/1989 | Copp | 156/583.1 |
| 4,963,221 | 10/1990 | Isobe et al. | 156/583.1 |
| 5,182,121 | 1/1993 | Miyashita et al. | 425/407 |

FOREIGN PATENT DOCUMENTS

| | | | |
|---|---|---|---|
| 59-104296 | 6/1984 | Japan | 156/583.1 |
| 60-127135 | 7/1985 | Japan | 156/583.1 |
| 62-282911 | 12/1987 | Japan | 156/583.1 |
| 63-242500 | 10/1988 | Japan | 100/48 |
| 3-128195 | 5/1991 | Japan | 156/583.1 |

*Primary Examiner*—Joseph W. Drodge
*Attorney, Agent, or Firm*—Antonelli, Terry, Stout & Kraus

[57] ABSTRACT

A hot press for producing a multilayered substrate including vertically opposing upper and lower bolsters relatively movable toward each other to press multilayered substrate blanks and to cool the plates after the bonding. A sealing arrangement includes a cylinder and encloses the upper and lower bolsters so as to define a hermetically sealed space, with an evacuating arrangement reducing the pressure inside the hermetically sealed space during heating and pressing in which a bonding agent in the multilayered substrate blanks is softened. A high-pressure gas supplying arrangement supplies a pressurizing gas into the hermetically sealed space so as to impart the bonding pressure. A pressure sensor detects the pressure inside the hermetically sealed space, and a controller effects a compensation for incremental increases in the bonding pressure when the pressure inside the hermetically sealed space is reduced by the evacuating arrangement and for incrementally decreasing the bonding pressure when the pressure inside the space is elevated by the pressurized gas, by feedback output signals of the pressure sensor to the hydraulic pressure source.

5 Claims, 6 Drawing Sheets

HOT PRESS FOR USE IN PRODUCTION OF MULTILAYERED SUBSTRATE

BACKGROUND OF THE INVENTION

1. Field of the Invention

The present invention relates to a hot press which is used in production of multilayered substrate and, more particularly, to a hot press which is suitable in forming a multilayered substrate, such as substrate of a printed circuit board or a ceramics board, having high degree of density and quality as well as reduced thickness, and which can reduce the production cost.

2. Description of the Related Art

Densifying a multilayered substrate essentially requires prevention of oxidation at the junctions and removal of voids between the layers of the multilayered substrate. To cope with such demands, a method has been proposed in, for example, Japanese Unexamined Patent Publication No. 62-156931, in which blanks of layers are enclosed in an enclosure made of a film or a sheet and are pressed by heat plates after the interior of the enclosure is evacuated.

Meanwhile, Japanese Unexamined Patent Publication No.3-128195 discloses an art in which a heat insulating plate is placed between heat plates for heating blanks of a multilayered substrate and bolsters which press the blanks through the heat plates, so as to uniformly apply heat to the blanks of the multilayered substrate. The space between the bolsters is enclosed by sealing means and is evacuated until the adhesive is softened and fluidized, whereas, during the setting, air pressure is applied to maintain a pressurized atmosphere in the space, thereby attaining uniform pressure distribution during bonding.

The bonding pressure applied during bonding is determined by dividing the area of the substrate surface to be bonded by the load applied by a main ram, when the bonding pressure is applied in atmospheric pressure. However, when the pressure in the chamber enclosing the heat plates has been reduced, the load applied by the main ram is increased by an amount corresponding to the product of the overall area of the space inside the chamber and the amount of reduction in the pressure. Thus, the bonding pressure, i.e., the substrate surface pressure, is increased. Conversely, when the space inside the chamber enclosing the heat plates is pressurized, the load applied by the main ram is reduced by an amount which is the product of the overall area of the space inside the chamber and the amount of increase in the pressure, thus reducing the bonding pressure.

The amount of dimensional change in the multilayered substrate after the bonding is largely influenced by the bonding pressure. Therefore, in a low-pressure forming process in which positive air pressure is applied to achieve a high precision of forming, it is necessary to exactly detect even a small variation in the bonding pressure and to feed such a small change back to the hydraulic pressure on the ram, otherwise the forming at the desired pressure is failed to impair the precision of formation of the product multilayered substrate.

Bonding by a conventional hydraulic pressure control system under application of air pressure tends to cause a bonding failure due to a significant reduction in the bonding pressure caused by a pneumatic reacting force or by a lowering of the bolster.

SUMMARY OF THE INVENTION

Accordingly, an object of the present invention is to provide a hot press which can set the bonding pressure to an optimum level, thereby making it possible to produce a multilayered substrate.

To achieve the object, the present invention provides a hot press having a pressure sensing means for sensing the pressure inside a hermetically sealed space defined by a cylinder and enclosing the upper and lower bolsters with substrate blanks placed on the lower bolster, and a control means for effecting a compensation for incrementally increasing the bonding pressure when the pressure inside the hermetically sealed space is reduced by evacuating means and for incrementally decreasing the bonding pressure when the pressure inside the space is elevated by pressurized gas, by feeding back the outputs of the pressure sensor to the pressure of the hydraulic pressure source to be applied to the main ram.

The amount of compensation to be effected on the hydraulic pressure of the main ram may be computed by a control section on the basis of the dimensions of the multilayered substrate, inside diameter of the cylinder employed in the sealing means and the pressures inside and outside the cylinder, so that the hydraulic pressure supplied to the main ram is automatically controlled in accordance with the computed compensation amount, whereby the bonding pressure applied to the multilayered substrate blanks is always optimized.

According to the present invention, blanks of a multilayered substrate are placed on the top surface of the lower heat plate, and upper and lower bolsters are enclosed in the cylinder of the sealing means, whereby the hermetically sealed space is defined.

Then, steps are executed for heating and pressing the blanks of the multilayered substrate so as to soften the adhesive (bonding resin) in the blanks, while reducing the hermetically sealed space by evacuation. After the softening of the adhesive, the space inside the hermetically sealed space is reset to the atmospheric pressure, thereby pressurizing the blanks of the multilayered substrate at the bonding pressure. A gas is supplied into the hermetically sealed space substantially at the same time as the start of the pressurizing of the sealed space, thereby elevating the pressure in the space so as to prevent any reduction in the boding pressure at the peripheral region of the blanks. The main ram is activated in this state so as to cause a relative movement between the upper and lower bolsters, thereby bonding the elements of the multilayered substrate.

The pressurizing instructions given to the main ram indicate the pressing force given by a control board based on the work conditions. Presuming that the hermetically sealed space is held under atmospheric pressure, the pressing force $F_0$ (kgf) is determined by the following equation:

$$F_0 = P = L_1 \times L_2 \tag{1}$$

wherein P represents the bonding pressure (kgf/cm$^2$), while $L_1 \times L_2$ represents the size of the blanks of the multilayered substrate (cm×cm).

When the press used is of the type which applies a pressure to the blanks of the multilayered substrate by a main ram through the lower bolster while the hermetically sealed space is evacuated, an upward force $F_1$ (kgf), as determined by the following equation, acts on the lower bolster, due to the effect of the atmospheric pressure.

$$F_1 = P_1 \times \pi D^2 / 4 \tag{2}$$

wherein $P_1$ represents the reduced pressure (kgf/cm$^2$) inside the hermetically sealed space, D represents the inside diameter (cm) of the cylinder which defines the hermetically sealed space.

Thus, when the pressure in the hermetically sealed space is reduced, the pressing force applied to the blanks of the multilayered substrate is greater by $F_1$ than the force $F_0$ which is applied when the atmospheric pressure is maintained inside the sealed space.

When high pressure is maintained in the hermetically sealed space, a downward force $F_2$ (kgf) determined by the following equations, acts on the lower bolster:

$$F_2 = P_2 \times (\tau D^2/4 - L_1 \times L_2) \qquad (3)$$

wherein $P_2$ represents the pressure (kgf/cm$^2$) inside the hermetically sealed space.

Consequently, when the hermetically sealed space is maintained at an elevated pressure, the pressing force applied to the blanks of the multilayered substrate is smaller by $F_2$ than the force $F_0$ which is applied when atmospheric pressure is maintained inside the sealed space.

According to the present invention, the pressure inside the hermetically sealed space is detected by a pressure detecting means and, when the pressure detecting means has detected that the pressure inside the space has been reduced, a pressurizing instruction value F is computed in a control section in accordance with the following equation, and is delivered to the source of the hydraulic pressure applied to the main ram.

$$F = F_0 - F_1 \qquad (4)$$

Conversely, when the pressure detecting means has detected that the pressure inside the hermetically sealed space has been elevated, pressurizing instruction value F is computed in the control section in accordance with the following equation and is delivered to the source of the hydraulic pressure applied to the main ram.

$$F = F_0 + F_2 \qquad (5)$$

Thus, an automatic control is performed in such a manner in as to maintain the bonding pressure at an optimum level regardless of any change in the pressure inside the hermetically sealed space. It is thus possible to produce multilayered substrates with high precision, without inter-layer voids while minimizing thickness variation of the substrate.

DESCRIPTION OF THE PREFERRED EMBODIMENTS

Figure 1:
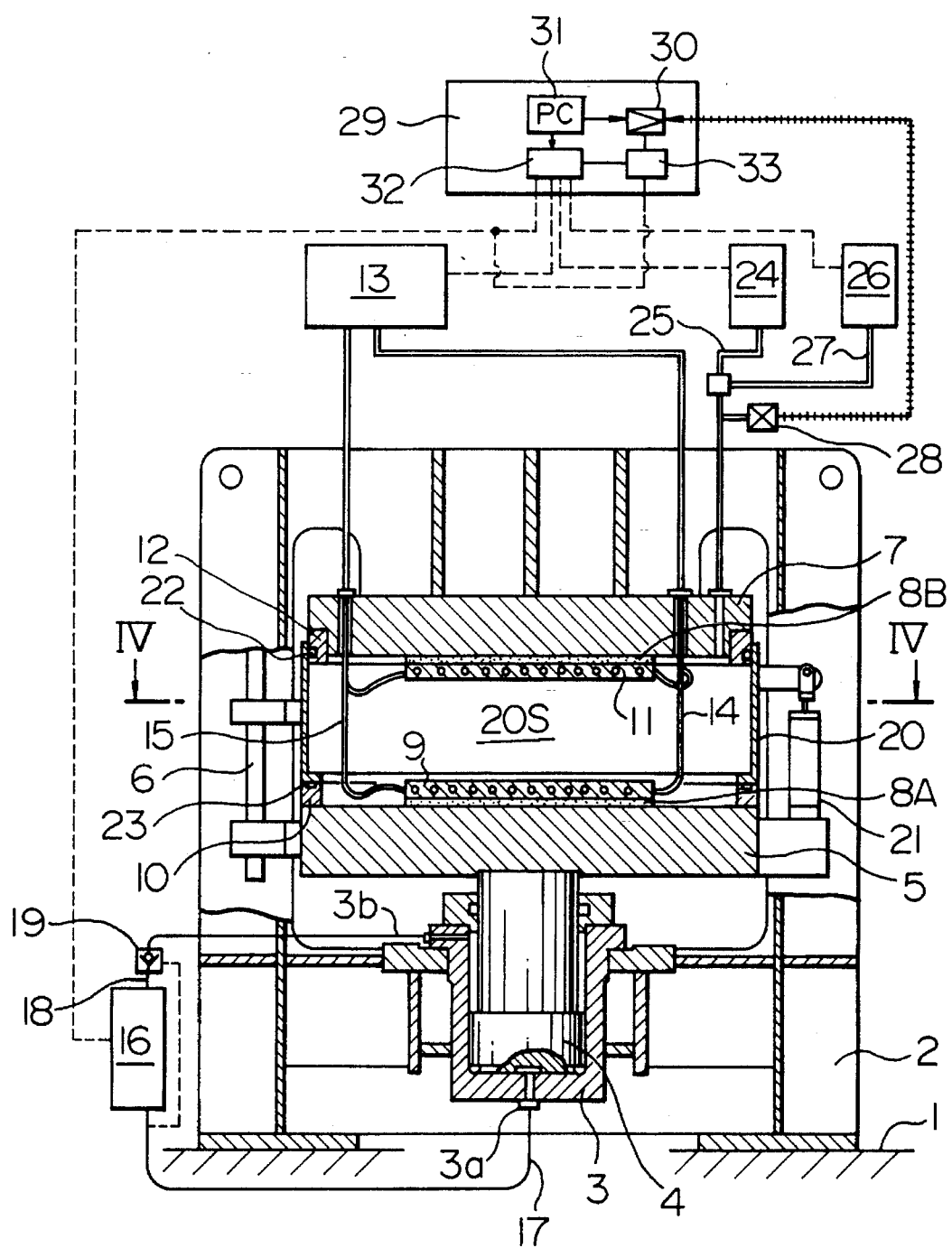
FIG. 1 is a a schematic vertical sectional view of an embodiment of the hot press in accordance with the present invention.

Referring to FIGS. 1 to 4, in particular to FIG. 1, a hot press embodying the present invention has a main hydraulic cylinder 3 mounted on the center of a frame 2 which is situated on a floor 1. The main hydraulic cylinder 3 receives a piston 4 to which is fixed a lower bolster 5. The bolster 5 moves up and down along a plurality of guide rails 6 which are fixed to the frame 2 as the piston 4 moves in the main hydraulic cylinder 3. The main hydraulic cylinder 3 and the piston 4 form a main ram. Thus, the lower bolster 5 is connected to the piston 4 of the main ram.

An upper bolster 7 is mounted on an upper portion of the frame 2 so as to oppose the lower bolster 5. A lower heat plate 9 is mounted on the upper face of the lower bolster 5 through a heat insulating plate 8A. A cylinder receiving ring 10 is mounted on the peripheral portion of the lower bolster 5. Similarly, an upper heat plate 11 is mounted on the upper bolster 7 through a heat insulating plate 8B. A cylinder guide 12 is mounted on the peripheral portion of the upper bolster 7.

Figure 4:
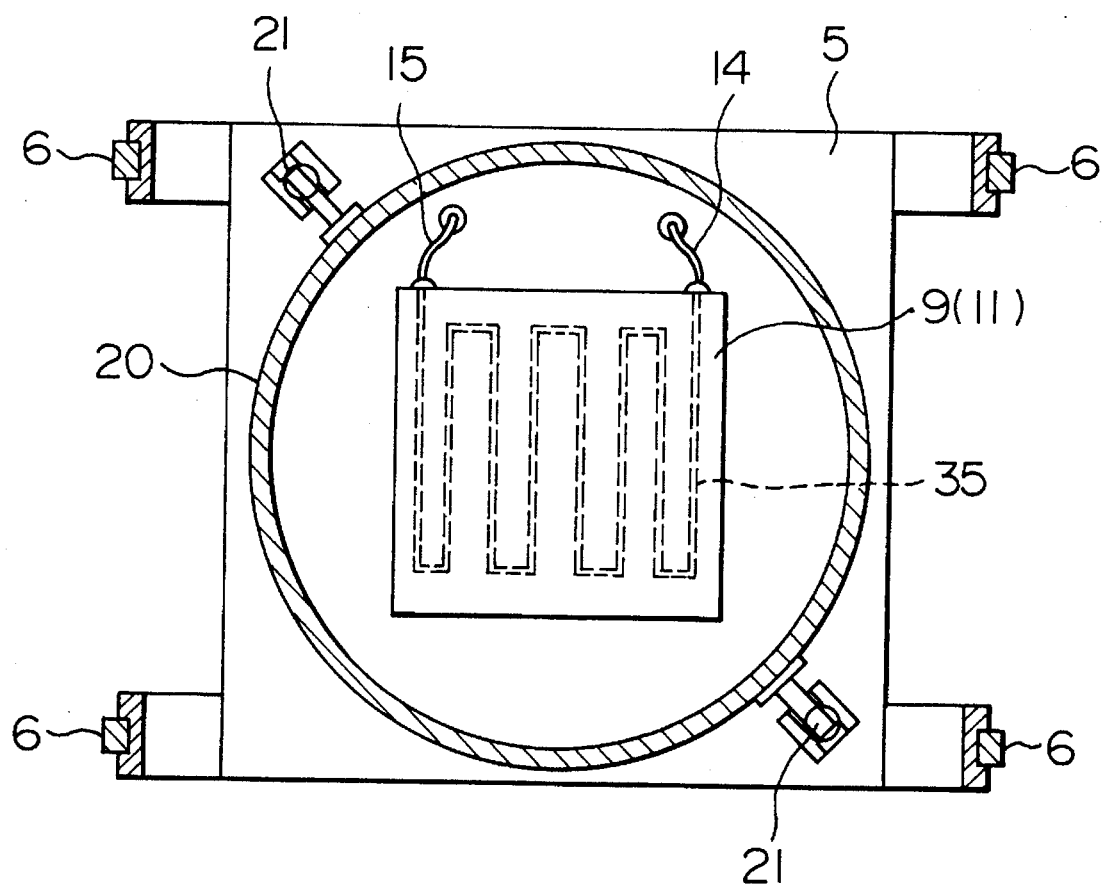
FIG. 4 is a cross-sectional view of the embodiment shown in FIG. 1 taken along a line IV—IV in FIG. 1.

As shown in FIG. 4, each of the lower heat plate 9 and the upper heat plate 11 has an internal passage 35 for a heat medium such as steam. As shown in FIG. 1, the heat medium is supplied to each heat plate 9, 11 through a heat medium supply hose 14 from a heating/cooling source 13 which constitutes the heating/cooling means and, after a heat exchange along the heat medium passage 35, returns to the heating/cooling source 13 through a heat medium return hose 15.

The main hydraulic cylinder 3 is supplied with hydraulic pressure from a hydraulic pressure source 16 through hydraulic pipes 17 and 18. The hydraulic pipe 17 is connected to a port 3a formed in the portion of the hydraulic cylinder 3 adjacent a head thereof, while the hydraulic pipe 18 is connected through a pilot check mechanism 19, to a port 3b formed in a portion of the hydraulic cylinder 3 adjacent the bolster 5.

A cylinder 20 surrounds the cylinder guide 12 secured to the side surface of the upper bolster 7. The cylinder 20 is connected to a lifting means 21 provided on the lower bolster 5, so as to be moved up and down by the lifting means 21. The cylinder guide 12 is provided with an upper sealing means 22. The cylinder receiving ring 10 is provided with a lower sealing means 23. The arrangement is such that the cylinder 20, the upper sealing means 22 and the lower sealing means 23 cooperate to form a hermetically sealed space 20S inside the cylinder 20 when the cylinder 20 has been moved to the lower stroke end. The hermetically sealed space 20S is evacuated through an evacuating passage 25 by an evacuating means 24 so that the pressure inside the space 20S is reduced. The hermetically sealed space 20S also is adapted to be supplied with a gas through a gas pipe 27 from a gas supplying means 26 so that the pressure inside the space 20S is elevated. The pressure inside the hermetically sealed space 20S is sensed by a pressure sensor 28 and is delivered to a computing unit 30 in a control section 29 which controls the heating/cooling source 13, the hydraulic pressure source 16, the evacuating means 24 and the gas supplying means 26.

Figure 2:
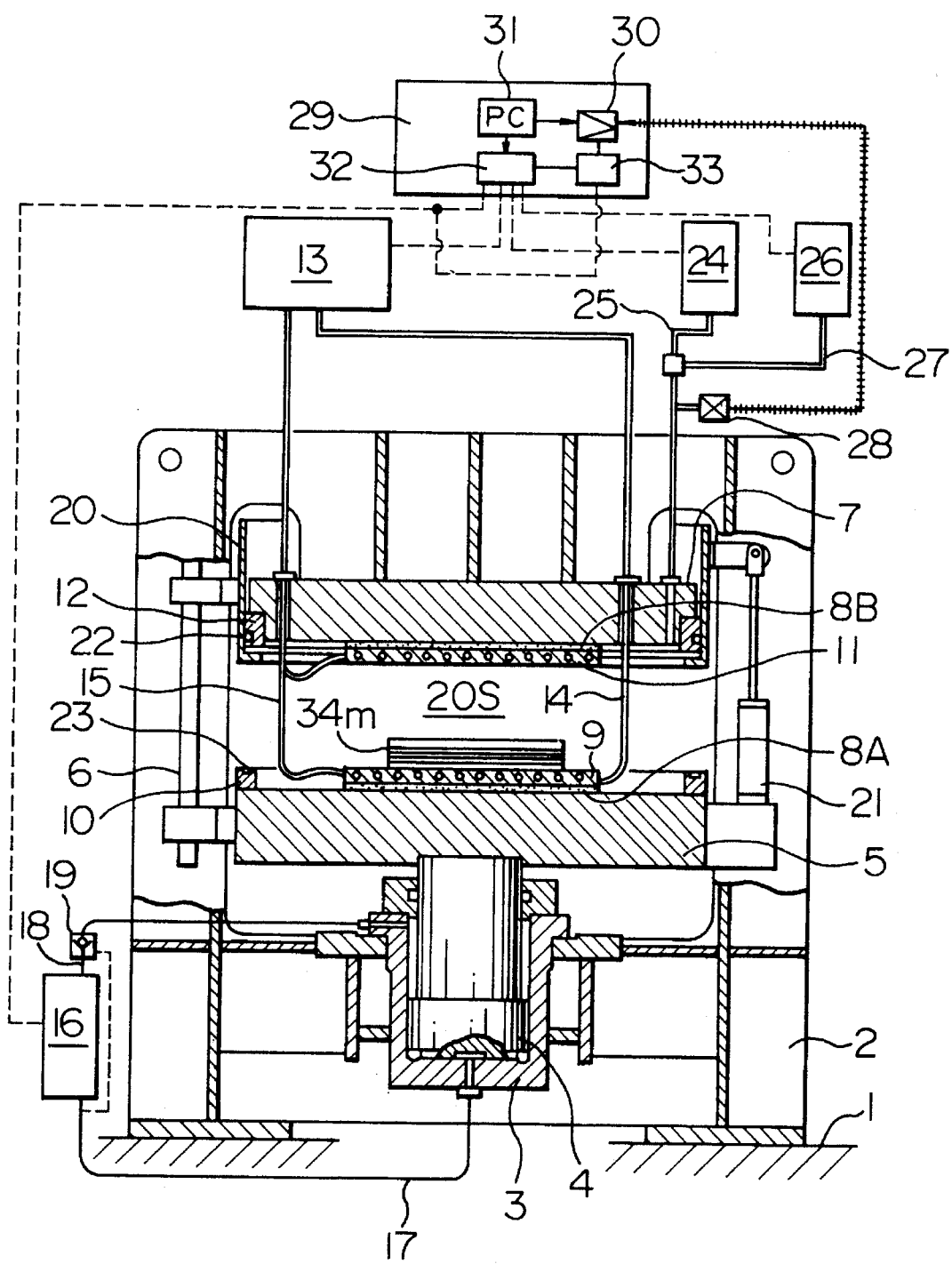
FIG. 2 is a schematic vertical sectional view of the embodiment shown in FIG. 1 in a state in which blanks of a multilayered substrate is placed on a lower heat plate.

FIG. 2 shows the cylinder 20 which has been lifted to and held at the upper stroke end by the lifting means 21. In this state, a blanks 34m of a multilayered substrate 34 are placed between the heat plates 9 and 11 and is located and placed on the lower heat plate 9.

Figure 3:
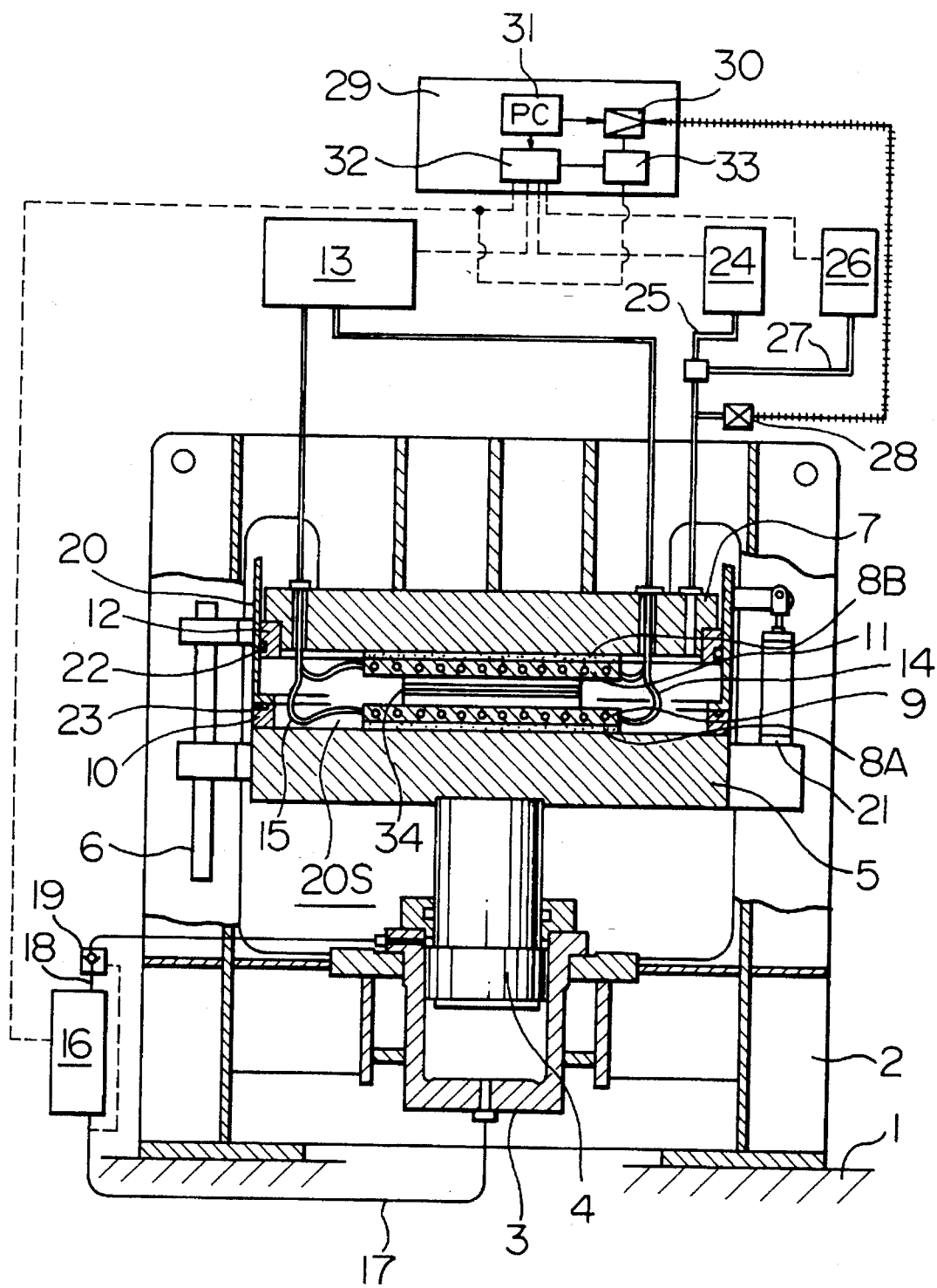
FIG. 3 is a schematic vertical sectional view of the embodiment shown in FIG. 1 in a state in which blanks of a multilayered substrate is being heated and pressed.

FIG. 3 shows the state of the hot press in which the cylinder 20 has been lowered as in FIG. 1, and the piston 4 is actuated by hydraulic pressure supplied from the hydraulic source 16 to lift the lower bolster 5, heat insulating plate 8A and the lower heat plate 9, thereby pressing the blanks 34m of the multilayered substrate 34 at a predetermined pressing force between the lower and upper heat insulating plate 8A and 8B, while heating and cooling operations are executed in accordance with a predetermined process using the heat medium supplied from the heating/cooling source 13, thereby effecting the bonding.

The control section 29 has a process condition setting unit 31, an operating portion 32 and a temperature/pressure commanding unit 33, in addition to the above-mentioned computing unit 30.

A description will now be made of the operation of the hot press in accordance with the present invention. Referring to FIG. 2, the cylinder 20 is lifted by the lifting means 21 up to the upper stroke end 21 and then the blanks 34m of the substrate 34 are inserted into the gap between the upper heat plate 11 and the lower heat plate 9 and is located and placed on the latter. Then, a lowering instruction is given to the lifting means 21 to lower the cylinder 20 as shown in FIG. 1.

Figure 5:
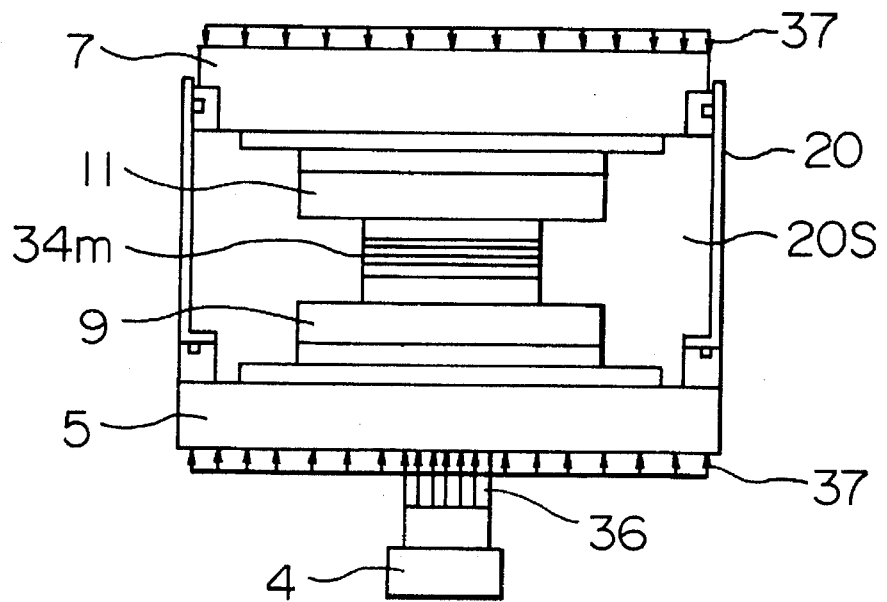
FIG. 5 is an illustration of the force applied to blanks of a multilayered substrate in a hot press of the type concerned, with the pressure in a hermetically sealed space reduced.

Subsequently, in order to prevent the lower bolster 5 from moving upward by the vacuum generated during evacuation, pressurized oil is supplied from the hydraulic pressure source 16 through the hydraulic pipe 18 via the rod-side port 3b. Thus, the upper and lower sealing means 22 and 23 form a hermetically sealed space inside the cylinder 20. Then, air is extracted from the hermetically sealed space 20S by the evacuating means 24 so as to reduce the pressure in the space down to a level of 5 to 50 Torr, in order to prevent oxidation of the junctions and to avoid any void formed in the region between the layers. When a predetermined vacuum has been established, pressurized oil is discharged from the rod-side port 3b of the main hydraulic cylinder 3, while pressurized oil is supplied through the head-side port 3a of the main hydraulic cylinder 3 from the hydraulic pressure source 16 via the hydraulic pipe 17. Consequently, the lower bolster 5 is lifted to pre-press the blanks 34m of the multilayered substrate 34 in order to ensure that the blanks 34m are uniformly heated between the lower heat plate 9 and the upper heat plate 11. This pre-pressing is conducted in accordance with the condition given by the process condition setting unit 31 so as to impart a surface pressure of 1 to 5 kgf/cm². At the same time, heat is applied by the lower and upper heat plates 9 and 11 so as to pre-heat the blanks 34m of the multilayered substrate 34 to about 130° C. In this state, the lower bolster 5 receives an external force produced as a result of the pressure reduction inside the cylinder 20, in addition to the pressing force 36 (see FIG. 5) exerted by the main hydraulic cylinder 3. In this embodiment, therefore, the pressure reduction inside the cylinder 20 is sensed by the pressure sensor 28, and the computing unit 30 of the control section 29 executes a computation of the equation (4) in accordance with the sensed pressure reduction, thereby generating a pressing instruction value F and delivering it to the hydraulic pressure source 16, thus enabling pressing at the set level of the bonding pressure.

Figure 6:
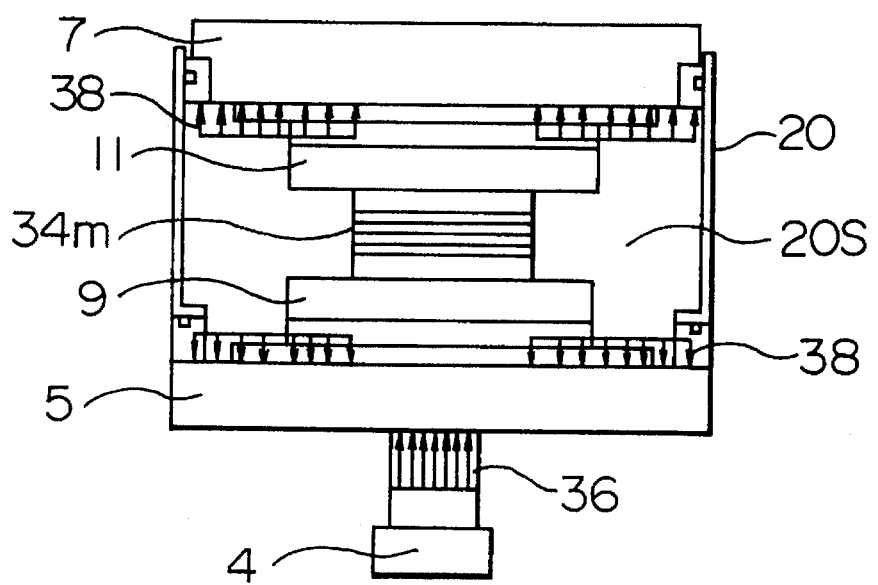
FIG. 6 is an illustration of the force applied to blanks of a multilayered substrate in a hot press of the type concerned, with the pressure in the hermetically sealed space increased by the supply of a gas.

This pressing is conducted for a period of five to ten minutes so that the bonding resin is softened and fluidized. After elapse of a predetermined period from the fluidizing of the bonding resin, atmospheric pressure is introduced into the space inside the cylinder 20, and the material of the blanks 34m of the multilayered substrate 34 are pressurized at a bonding pressure of 5 to 30 kgf/cm² set by the process condition setting unit 31 of the control section 29. Nitrogen gas or air of a predetermined pressure is introduced into the hermetically sealed space 20S from the gas supplying means 26 substantially simultaneously with the start of the pressing, thereby preventing the bonding pressure from decreasing at the peripheral portion of the material 34m of the multilayered substrate 34. The pressure of the nitrogen gas or air and the duration of supply of the gas or air vary according to the type of the bonding resin used and the bonding pressure to be developed. Generally, however, the pressure ranges between 3 and 10 kgf/cm², while the duration is from thirty to sixty minutes. In this state, the lower bolster 5, the upper bolster 7, the lower heat plate 9 and the upper heat plate 11 are pressed by pneumatic pressure 38 which acts counter to the pressing force 36 exerted by the main hydraulic cylinder 3, as shown in FIG. 6. In the illustrated embodiment, therefore, the pneumatic pressure 38 is sensed by the pressure sensor 28 and the computing unit 30 of the control section executes the computation of the equation (5) using the sensed pressure value. The computing unit 30 then delivers a pressurizing instruction value F to the hydraulic source 16 such that the pressing is conducted at the bonding pressure given by the process condition setting unit 31. After completion of the heating and pressurizing by the gas, a cooling medium is supplied from the heating/cooling source 13 to the lower and upper heat plates 9 and 11, thereby cooling the multilayered substrate 34. When the multilayered substrate has been cooled down to a level substantially the same as the room temperature, the pressing by the main hydraulic cylinder 3 is finished and the lower bolster 5 is lowered to the lower stroke end as shown in FIG. 2. Then, the cylinder 20 is raised to the upper stroke end, thus completing the bonding operation.

Figure 7:
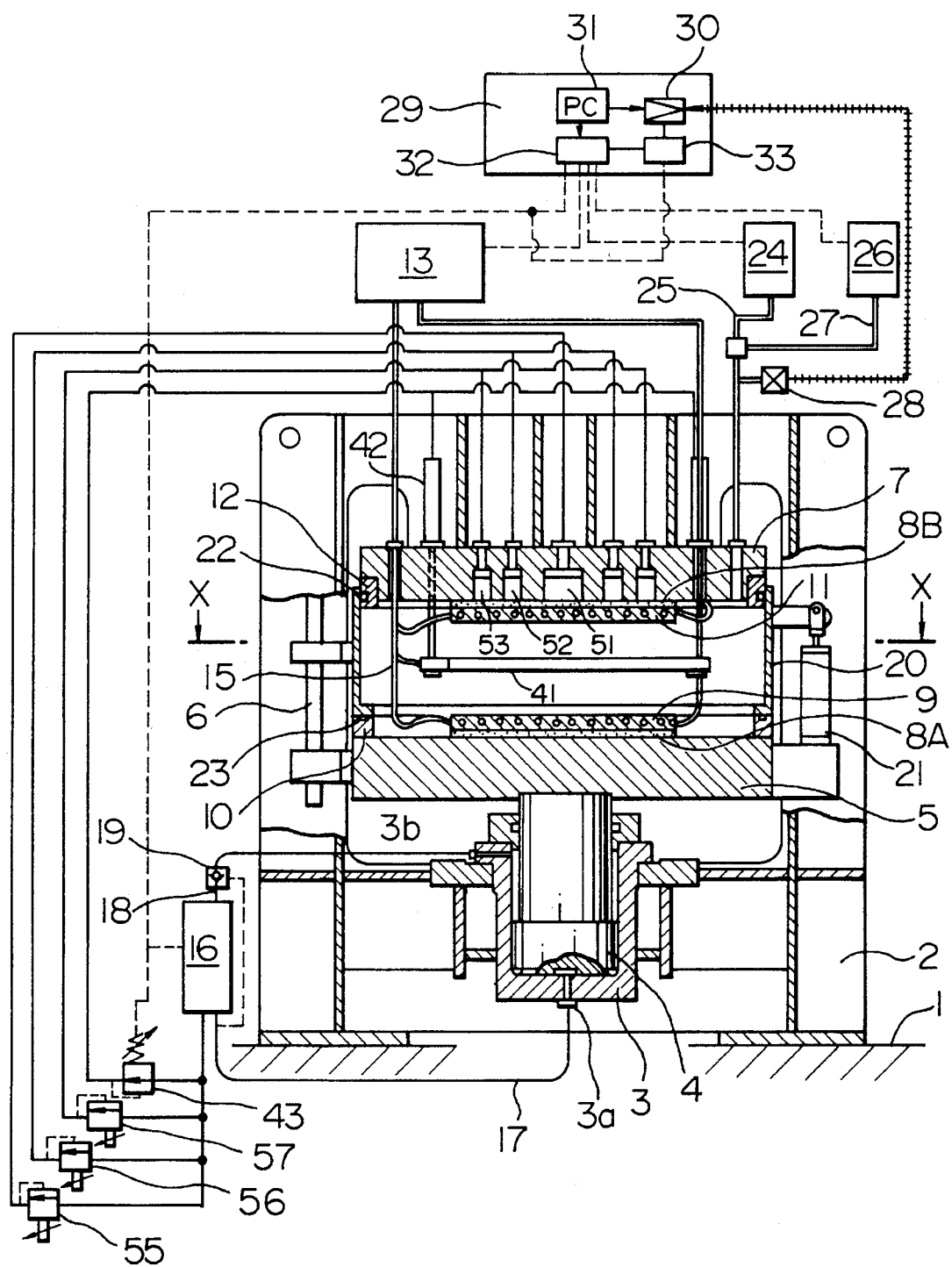
FIG. 7 is a schematic vertical sectional view of another embodiment of the hot press in accordance with the present invention.

The embodiment shown in FIG. 7 has features which are not employed in the embodiment shown in FIG. 1. Namely, this embodiment has an intermediate heat plate 41 suspended by counter cylinders 42 and disposed between the upper and lower bolsters 5 and 7, and a plurality of auxiliary rams 51 to 53 concentrically embedded in the upper bolster 7.

The intermediate heat plate 41 is adapted to be moved up and down by the pressurized oil which is supplied through a counter cylinder pressure regulating valve 43, for example, when the multilayered substrate blanks are pressed. The auxiliary rams 51 to 53 are moved up and down in accordance with the supply of hydraulic oil supplied through reducing valves 55 to 57 associated with the auxiliary rams 51 to 53.

As is the case of the upper and lower heat plates 9 and 11, the intermediate heat plate 41 is supplied with a heat medium or a cooling medium from the heating/cooling medium 13. The intermediate heat plate 41 can support a multilayered substrate blank thereon, so that the number of the blanks pressed in one pressing cycle is increased.

When the lower bolster 5 is lifted to press the multilayered substrate blanks between the upper heat plate 11 and the intermediate heat plate 41 and between the intermediate heat plate 41 and the lower heat plate 9, the bolsters 5 and 7 may be so deflected as to convex or concave at their central portions, thus impairing non-uniform pressing. In order to avoid this problem, the auxiliary rams 51 to 53 are suitably operated to compensate such deflection, thereby ensuring that the multilayered substrate blanks are uniformly pressed at their central and peripheral portions.

The reducing valves 55 to 57 for controlling the pressures of hydraulic oil supplied to the auxiliary rams 51 to 53 and the pressure regulating valve 43 for the counter cylinder are controlled in accordance with instructions given by the operation unit 32 of the control section 29.

More specifically, the auxiliary rams 51 to 53 are controlled in accordance with instructions given by the operation unit 32 which operates in response to result of computation performed by the computing unit 30 of the control section 29 in accordance with pressure distribution over the heat insulating plate 8B sensed by a pressure sensor embedded in the heat insulating plate 8B.

In this embodiment, pneumatic pressures 37 and 38 acting in the hermetically sealed space 20S during pre-pressing and main pressing are sensed by the pressure sensor 28 and the hydraulic pressure source 16 is controlled in accordance with the sensed pressure, as in the case of the first embodiment described in connection with FIG. 1. The system for effecting such a control is not described in detail because it is substantially the same as that used in the first embodiment.

Although the invention has been described by way of its specific forms, it is to be understood that the described embodiments are only illustrative and various changes and modifications may be imparted thereto.

For instance, in the embodiment shown in FIG. 7, the auxiliary rams may be provided on the lower bolster.

It is also to be understood that the number of intermediate heat plates is not limited to one.

In addition, the embodiment shown in FIG. 7 may be modified such that either of the intermediate heat plate and the auxiliary rams is omitted, although the described embodiment employs both the intermediate heat plate and the auxiliary rams.

As has been described, according to the present invention, pressure compensation is effected by sensing the pressure inside the hermetically sealed space by pressure sensing means and feeding a signal back to the hydraulic pressure source for supplying hydraulic pressure to the main ram in such a manner as to cancel increment of the bonding pressure when the pressure inside the hermetically sealed space has been reduced and to cancel decrement of the bonding pressure when the pressure inside the hermetically sealed space has been elevated. Consequently, the bonding pressure can constantly be controlled to the optimum level, both in the heating/pressing operation for softening the bonding agent under reduced pressure inside the hermetically sealed space and in the pressing operation in which a gas is introduced into the hermetically sealed space to effect the bonding under the elevated pressure. It is therefore possible to produce multilayered substrates at a high degree of precision without any inter-layer voids while minimizing thickness variation of the product substrate.

Consequently, the yield of the product is increased to reduce the production cost.

In addition, the hydraulic pressure to be supplied to the main ram is automatically controlled in such a manner as to optimize the bonding pressure applied to the multilayered substrate blanks, by giving pressure correction instruction to the hydraulic pressure source of the main ram in accordance with the result of a computation executed on the basis of the dimensions ($L_1$, $L_2$) Of the multilayered substrate, inside diameter (D) of the sealing means and the pressures ($P_1$, $P_2$) inside and outside the cylinder, thereby ensuring that the bonding operation is stably conducted at the optimum bonding pressure.

What is claimed is:

1. A hot press for producing a multilayered substrate, comprising:

upper and lower bolsters which are arranged to vertically oppose each other and to be movable relative to and toward each other to press multilayered substrate blanks therebetween;

a main ram for imparting relative movement between said upper and lower bolsters to produce a pressing force;

upper and lower heat plates which are provided on said upper and lower bolsters through heat insulating plates respectively;

heating and cooling means for heating said upper and lower heat plates during bonding of said multilayered substrate blanks and for cooling said plates after the bonding;

sealing means including a cylindrical member and defining a hermetically sealed space of variable volume in cooperation with said upper and lower bolsters;

evacuating means for evacuating said hermetically sealed space to reduce the pressure therein during a heating and pressing operation, performed by said heating and cooling means and by said main ram, for softening a bonding agent for said multilayered substrate blanks;

gas supplying means for supplying gas into said hermetically sealed space to elevate the pressure in said space, thereby imparting a bonding pressure to said multilayered substrate blanks during the bonding;

pressure sensing means for sensing the pressure inside said hermetically sealed space; and control means for effecting pressure compensation by controlling pressure of a hydraulic pressure source to be supplied to said main ram in accordance with outputs from said pressure sensing means so as to cancel an increment in the bonding pressure on said blanks, when the pressure in said hermetically sealed space is reduced by said evacuating means, and to cancel a decrement in the bonding pressure on said blanks when the pressure in said space is elevated by said gas supplying means.

2. A hot press according to claim 1, wherein said control means includes a computer means which computes said increment in the bonding pressure as a product ($P_{1} \times \pi D^{2}/4$) of the pressure $P_1$ inside said hermetically sealed space and an area $\pi D^{2}/4$ determined by the inside diameter D of said cylindrical member defining said hermetically sealed space, and also computes said decrement in the bonding pressure as a product of the pressure $P_2$ inside said hermetically sealed space and a value ($\pi D^{2}/4 - L_{1} \times L_{2}$) obtained by subtracting the area ($L_{1} \times L_{2}$) of the multilayered substrate from the area $\pi D^{2}/4$ determined by said cylindrical member inside diameter D. pressure over said multilayered substrate blanks attributable to a warp of each bolster during the bonding.

3. A hot press according to claim 1, further comprising an one intermediate heat plate disposed between said upper and lower heat plates and lifting means for lifting and lowering said intermediate heat plate.

4. A hot press for producing a multilayered substrate, comprising:

upper and lower bolsters arranged to vertically oppose each other and to be movable relative to and toward each other to press multilayered substrate blanks therebetween;

a main ram for imparting relative movement between said upper and lower bolsters to produce a pressing force;

upper and lower heat plates provided on said upper and lower bolsters through heat insulating plates, respectively;

heating and cooling means for heating said upper and lower heat plates during bonding of said multilayered substrate blanks and for cooling said plates after bonding;

sealing means including a cylinder and defining a hermetically sealed space in cooperation with said upper and lower bolsters;

evacuating means for evacuating said hermetically sealed space to reduce the pressure therein during a heating and pressing operation, performed by said heating and cooling means and by said main ram, for softening a bonding agent for said multilayered substrate blanks;

gas supplying means for supplying gas into said hermetically sealed space to elevate the pressure in said space, thereby imparting a bonding pressure to said multilayered substrate blanks during the bonding;

pressure sensing means for sensing the pressure inside said hermetically sealed space;

control means for effecting pressure compensation by controlling pressure of a hydraulic pressure source to be supplied to said main ram in accordance with outputs from said pressure sensing means so as to cancel an increment in the bonding pressure on said multilayered substrate blanks when the pressure in said hermetically sealed space is reduced by said evacuating means, and to cancel a decrement in the bonding pressure on said multilayered substrate blanks when the pressure in said hermetically sealed space is elevated by said gas supplying means; and an auxiliary ram provided on at least one of said upper and lower bolsters and capable of effecting compensation for non-uniform distribution of the bonding pressure to said multilayered substrate blanks attributable to warpage of at least one of said bolsters during the bonding.

5. A hot press according to claim 3, further including an intermediate heat plate disposed between said upper and lower heat plates and lifting means for lifting and lowering said intermediate heat plate.

* * * * *